United States Patent
Prahbu et al.

(10) Patent No.: US 6,439,964 B1
(45) Date of Patent: Aug. 27, 2002

(54) METHOD OF CONTROLLING A POLISHING MACHINE

(75) Inventors: Gopalakrishna B. Prahbu, Sunnyvale; Steven T. Mear, Los Gatos, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 09/608,418

(22) Filed: Jun. 30, 2000

Related U.S. Application Data

(60) Provisional application No. 60/158,753, filed on Oct. 12, 1999.

(51) Int. Cl.$^7$ .......................... B24B 49/00; B24B 51/00
(52) U.S. Cl. ................................. 451/8; 451/9; 451/41
(58) Field of Search .............................. 451/5, 8, 9, 28, 451/41, 10

(56) References Cited

U.S. PATENT DOCUMENTS

| | | |
|---|---|---|
| 4,793,895 A | 12/1988 | Kaanta et al. |
| 4,940,507 A | 7/1990 | Harbarger |
| 5,474,644 A | 12/1995 | Kato et al. |
| 5,514,245 A | 5/1996 | Doan et al. |
| 5,599,423 A | 2/1997 | Parker et al. |
| 6,113,465 A * | 9/2000 | Kim et al. ................. 451/41 |
| 6,213,848 B1 * | 4/2001 | Campbell et al. ............. 451/41 |

* cited by examiner

*Primary Examiner*—Timothy V. Eley
(74) *Attorney, Agent, or Firm*—Fish & Richardson

(57) ABSTRACT

Recipes for the polishing machine, such as recipes for carrier head pressure, are generated from empirical data, and consequently can provide a more accurate prediction than techniques based upon theoretical models. A plurality of test substrates are polished with a plurality of parameter sets. A polishing profile is measured for each of the plurality of test substrates, and a polishing time is calculated for each polishing parameter set which minimizes the difference between a predicted substrate profile and a desired substrate profile.

12 Claims, 4 Drawing Sheets

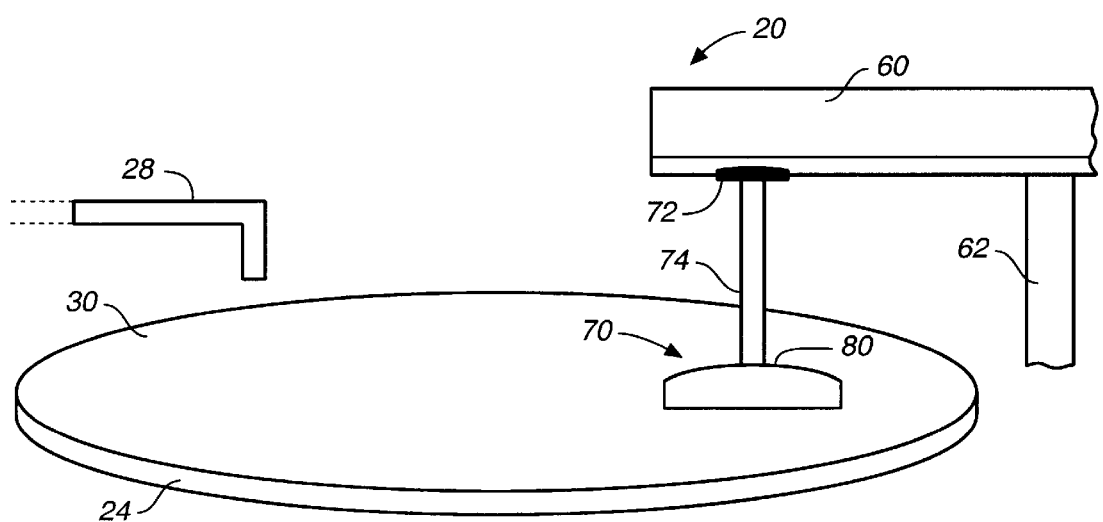
FIG._1

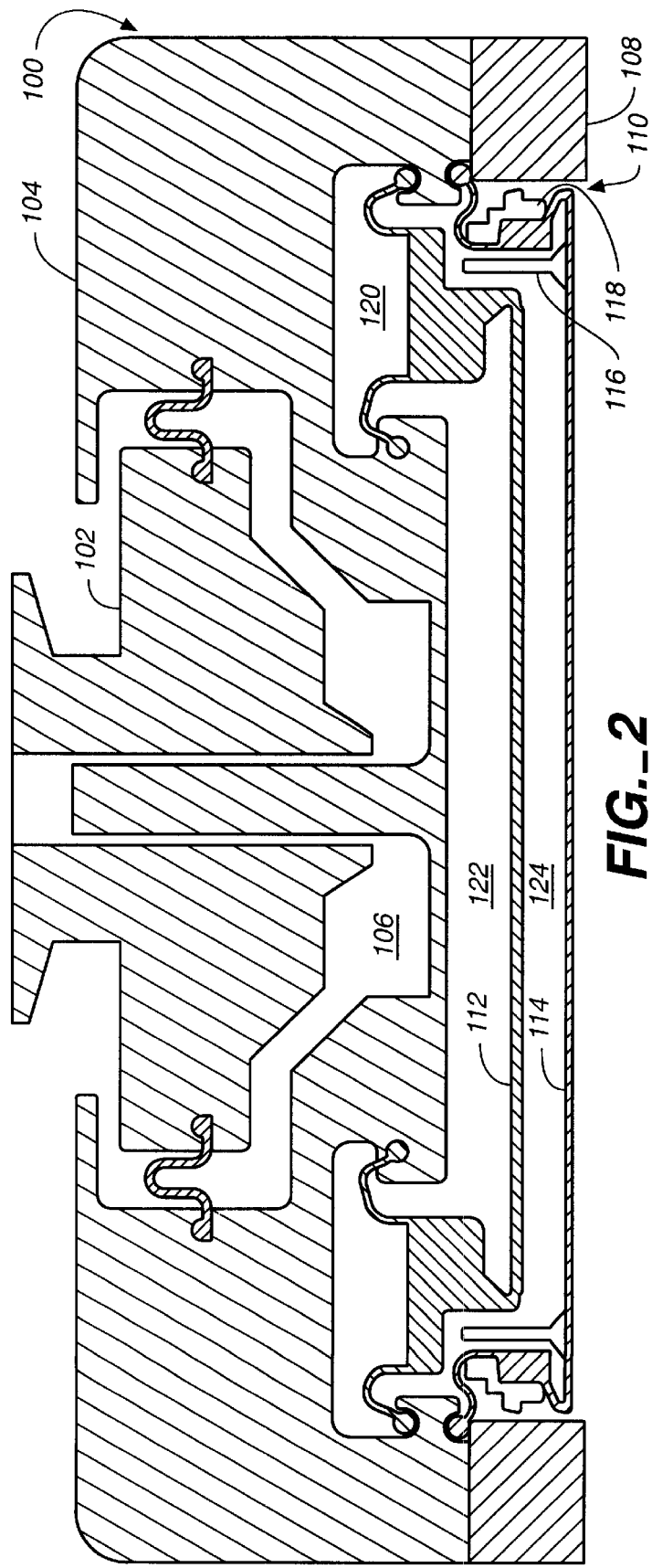
FIG._2

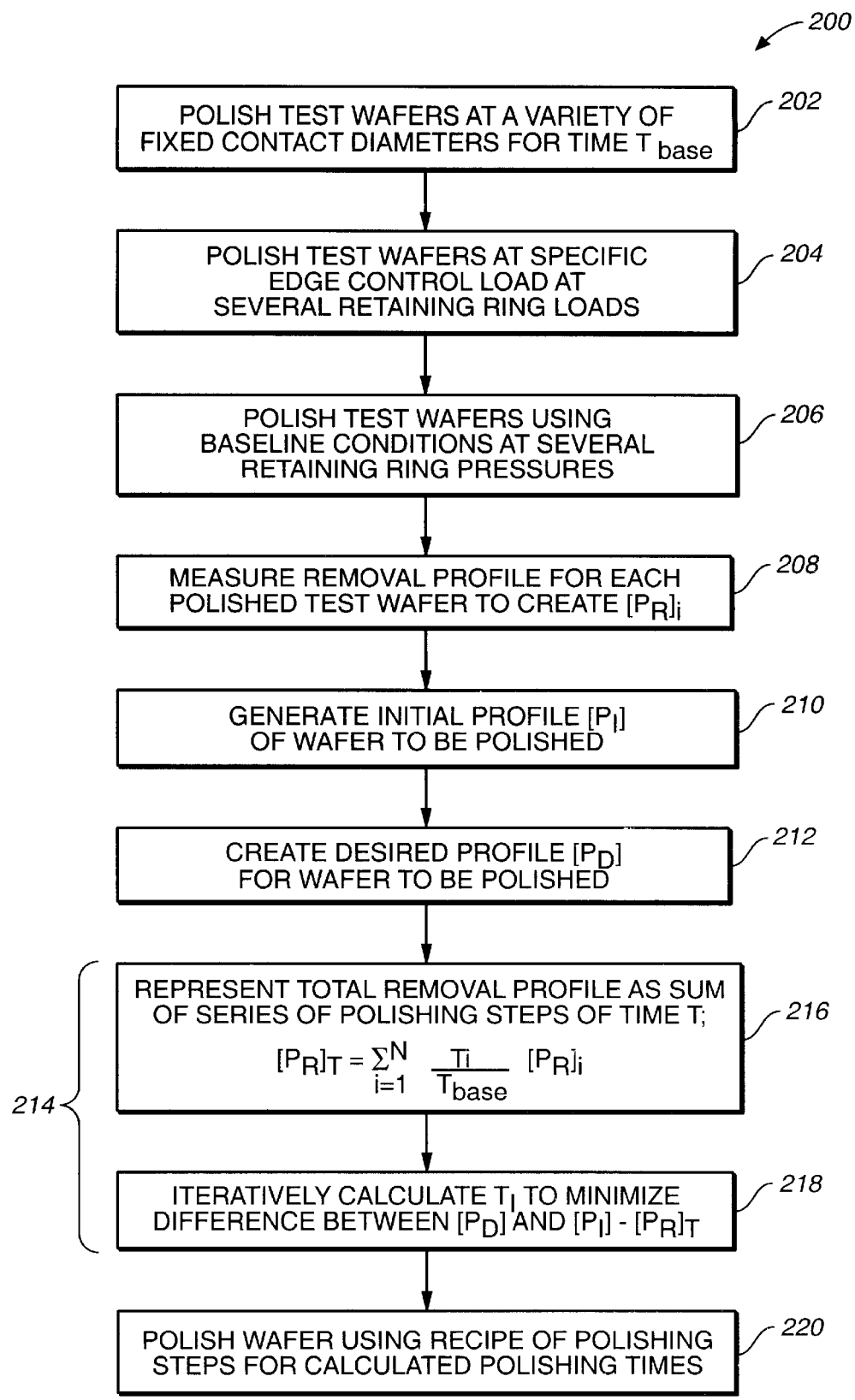
FIG._3

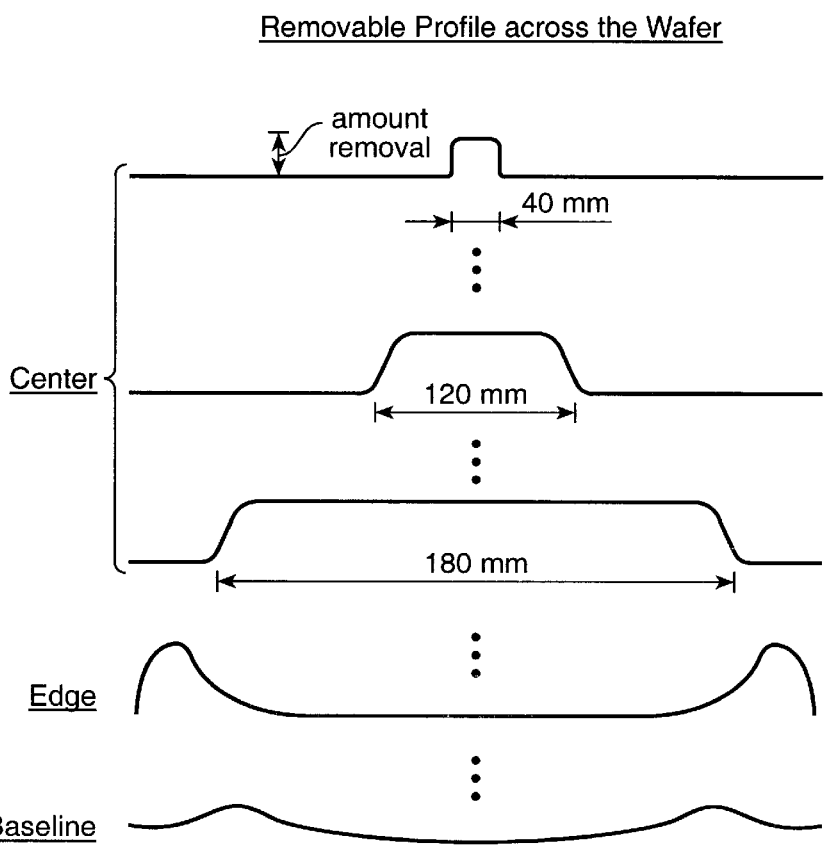
FIG._4

METHOD OF CONTROLLING A POLISHING MACHINE

CROSS-REFERENCE TO RELATED APPLICATION

This application claims priority to Provisional U.S. Application Serial No. 60/158,753, filed Oct. 12, 1999.

BACKGROUND

The present invention relates to chemical mechanical polishing of substrates, and more particularly to a method of controlling a polishing machine.

Integrated circuits are typically formed on substrates, particularly silicon wafers, by the sequential deposition of conductive, semiconductive or insulative layers. After each layer is deposited, it is etched to create circuitry features. As a series of layers are sequentially deposited and etched, the outer or uppermost surface of the substrate, i.e., the exposed surface of the substrate, becomes increasingly nonplanar. This nonplanar surface presents problems in the photolithographic steps of the integrated circuit fabrication process. Therefore, there is a need to periodically planarize the substrate surface to provide a planar surface. Planarization, in effect, polishes away a non-planar, outer surface, whether a conductive, semiconductive, or insulative layer, to form a relatively flat, smooth surface.

Chemical mechanical polishing (CMP) is one accepted method of planarization. This planarization method typically requires that the substrate be mounted on a carrier or polishing head, with the surface of the substrate to be polished exposed. The substrate is then placed against a rotating polishing pad. In addition, the carrier head may rotate to provide additional motion between the substrate and polishing surface. Further, a polishing slurry, including an abrasive and at least one chemically active agent, may be spread on the polishing pad to provide an abrasive chemical solution at the interface between the pad and substrate.

The effectiveness of a CMP process may be measured by its polishing rate and by the resulting finish (roughness) and flatness (lack of large scale topography) of the substrate surface. Inadequate flatness and finish can produce substrate defects. The polishing rate sets the time needed to polish a layer and the maximum throughput of the polishing apparatus.

A typical chemical mechanical polisher is controlled by software that follows a recipe, i.e., a series of polishing steps with each step being performed with a preselected set of machine parameters, such as platen rotation rate, slurry delivery rate, and the like. Unfortunately, generating polishing recipes can be time-consuming and difficult, as each recipe is generated through trial and error.

SUMMARY

In general, in one aspect, the invention is directed to a method of determining a polishing recipe. In the method, a plurality of test substrates are polished with a plurality of parameter sets. A polishing profile is measured for each of the plurality of test substrates, and a polishing time is calculated for each polishing parameter set which minimizes the difference between a predicted substrate profile and a desired substrate profile.

Implementations of the invention may include one or more of the following. A device substrate may be polishing using each of the polishing parameter sets in series for the polishing time calculated for that parameter set. An initial profile for the device substrate may be determined, and the predicted substrate profile may be calculated from a difference between a total polishing profile and the initial polishing profile. The total polishing profile may be calculated from a sum of the products of the polishing times and the associated measured profiles of the test substrates.

In another aspect, the invention is directed to a method of determining a polishing recipe. In the method, a plurality of test substrates are polished with a plurality of carrier head parameter sets that can be used during polishing of actual device substrates. This includes polishing a first set of test substrates to determine a variation in polishing profile as a function of the contact region diameter and polishing a second set of test substrates to determine the variation in the polishing profile as a function of the retaining ring pressure. An amount of material removed is measured at a plurality of different radial positions on each test substrate, a desired profile is created which represents the desired thickness across the substrate; and a polishing time is calculated for each of the plurality of carrier head parameter sets that will result in predicted substrate profile substantially equal to the desired substrate profile.

Implementations of the invention may include polishing a third set of test substrates to determine the variation in the polishing profile as a function of the edge control ring pressure.

Particular implementations of the invention may have one or more of the following advantages. A polishing recipe can be generated with improved polishing uniformity. Recipes for the carrier head pressure can be generated from empirical data, and consequently can provide a more accurate prediction than techniques based on theoretical models. Recipes can be generated quickly.

DESCRIPTION OF DRAWINGS

FIG. 1 is an illustration of a CMP apparatus.

FIG. 2 is a schematic cross-sectional view of a carrier head in a chemical mechanical polishing system.

FIG. 3 is a flow chart illustrating the method performed in the present invention.

FIG. 4 is an illustration of the polishing profiles generated by polishing a series of wafers with different polishing parameters.

Like reference symbols in the various drawings indicate like elements.

DETAILED DESCRIPTION

In general, the invention provides a method of determining a polishing recipe to achieve uniform planarity across a wafer surface as a result of chemical mechanical polishing. The method includes polishing a plurality of test substrates with a plurality of test substrates, measuring a polishing profile for each of the plurality of test substrates, and calculating a polishing time for each polishing parameter set which minimizes the difference between a predicted substrate profile and a desired substrate profile.

By performing the method, polishing recipes can be generated automatically. Initially, empirical data is accumulated by measuring the removal profile for each polishing step. In order to generate the polishing recipe, the system calculates a scale factor for each basic polishing step. This scale factor determines the amount of time spent polishing with that parameter profile. The scale factors are selected so that variations in the final wafer profile are minimized. During polishing, each polishing step is performed in series for the calculated amount of time.

FIG. 1 shows a CMP apparatus 20. Although only a single polishing station is illustrate, the CMP apparatus may include multiple stations. The polishing station includes a rotatable platen 24 on which is placed a polishing pad 30. Each polishing station may also include a slurry delivery port 28, and an unillustrated pad conditioner apparatus to maintain the condition of the polishing pad so that it will effectively polish substrates.

A rotatable carousel 60 supported by a center post 62 holds one or more carrier head systems 70. Each carrier head system 70 includes a carrier or carrier head 100. A carrier drive shaft 74 connects a carrier head rotation motor (not shown) to each carrier head 100 so that each carrier head can independently rotate about its own axis. In addition, each carrier head 100 independently laterally oscillates in a radial slot 72 formed in carousel support plate 66.

FIG. 2 shows a carrier head 100 from a chemical mechanical polishing apparatus. Similar carrier heads are described in more detail in U.S. application Ser. No. 60/114,182, filed Dec. 30, 1998, and in U.S. application Ser. No. 09/470,820, filed Dec. 23, 1999, the entirety of which are incorporated herein by reference. The carrier head 100 includes a housing 102, a base assembly 104, a loading chamber 106, a retaining ring 108, and a substrate backing assembly 110. The substrate backing assembly 110 includes an internal membrane 112, and an external membrane 114 that define three pressurizable chambers, such as a floating upper chamber 120, a floating lower chamber 122, and an outer chamber 124. By varying the pressures in the chambers using unillustrated passages through the housing 102 and the base 104, the user can vary both radius of the contact area between the inner flexible membrane 122 and the outer flexible membrane 124 (and thus the radius of the pressurized region on the wafer), and the pressure of the outer membrane 124 against the wafer in the contact area.

The carrier head also includes a spacer ring 116 located between the retaining ring 108 and the external membrane 118, and an edge load structure 118 located in the outer chamber 124. By pressurizing the floating upper chamber 120 and evacuating the floating lower chamber 122, the edge load structure 118 can be pressed against the upper surface of the external flexible membrane 114 to provide additional local pressure in an annular area on the back surface, e.g., near the perimeter or edge, of the wafer. In addition, the pressure of the retaining ring 108 against the polishing surface can be varied by selecting the pressure in the loading chamber 106.

Referring to FIG. 3, a recipe for controlling the pressures in the various chambers is generated in a method 200. In general, the polishing method assumes that each step in a series of basic polishing steps (each with a preselected set of carrier head parameters) will be performed. Initially, empirical data is accumulated by measuring the removal profile for each polishing step. In order to generate the polishing recipe, the system calculates a scale factor for each basic polishing step. This scale factor determines the amount of time spent polishing with that parameter profile. The scale factors are selected so that variations in the final wafer profile are minimized. During polishing, each polishing step is performed in series for the calculated amount of time.

Initially, test wafers are polished with the carrier head parameters that will be used during polishing of actual device wafers. One set of wafers can be polished to determine the variation in the polishing profile as a function of the contact region diameter (step 202). Another set of wafers can be polished to determine the variation in the polishing profile as a function of the edge control ring pressure (step 204). Yet another set of wafers can be polished to determine the variation in the polishing profile as a function of the retaining ring pressure (206).

As an example, in step 202, one wafer can be polished with a 40 mm diameter contact area, another wafer can be polished with a 60 mm diameter contact area, and so on in 20 mm increments up to a contact area diameter of 180 mm. Each wafer is polished with the same contact pressure $P_{CA1}$ (although the contact region diameter differs) and for the same time, e.g., 30 seconds. In step 204, one wafer can be polished with an edge control ring pressure $P_{ELR1}$ and a retaining ring pressure $P_{RR1}$, a second wafer can be polished with an edge control ring pressure $P_{ELR2}$ and a retaining ring pressure $P_{RR1}$, a third wafer can be polished with an edge control ring pressure $P_{ELR1}$ and a retaining ring pressure $P_{RR2}$, and a fourth wafer can be polished with edge control ring pressure $P_{ELR2}$ and a retaining ring pressure $P_{RR2}$. Again, each wafer is polished for the same time, e.g., 30 seconds, and with minimal or no contact region pressure. Finally, in step 206, several wafers are polished at "baseline" conditions (i.e., no center or edge ring pressure) at several retaining ring pressures.

Once the wafers have been polished, the amount of material removed is measured at several different radial positions on each wafer (step 208). This creates a "database" with a polishing profile for each set of polishing parameters. Sample wafer polishing profiles resulting from steps 202–206 are illustrated in FIG. 3. This database will be used by the recipe generator when calculating the polishing time for each polishing step.

Once the test wafers have been polished and the polishing profiles of the test wafers have been measured, an initial profile of a substrate can be generated (step 210). In a test environment, the initial profile can simply be assumed from the manufacture's specifications, whereas in a fabrication environment, the initial profile of a wafer to be polished can be measured with a metrology device. The measurements from the metrology device can be entered manually into the recipe generator. The recipe generator creates an initial profile $[P_I]$, where $[P_I]$ is a 1×M row matrix, M is the number measurement points, and one measurement is placed in each row of the matrix.

Before or after creation of the initial profile and the polishing of the test wafers, the user creates a desired profile which represents the desired thickness across the wafer (step 212). The desired profile can be represented by a 1×M row matrix $[P_D]$. Specifically, the user can specify a desired end thickness, and the recipe generator can enter this desired end thickness into each row of the matrix.

Once the test wafers have been polished, the polishing profiles of the test wafers have been measured, and the initial and desired profiles have been created, the polishing recipe can be generated (step 214). The information in the database can be represented as a series of removal profiles $[P_R]_i$ where each removal profile $[P_R]_1, [P_R]_2, \ldots, [P_R]_N$ is a 1×M row matrix filled with the measurements from the polishing steps 1, 2, ..., N, respectively.

The total removal profile $[P_R]_T$ (i.e., the amount removed as a function of the radius) can be calculated (step 216) as follows:

$$[P_R]_T = \sum_{i=1}^{N} \frac{T_i}{T_{base}} \cdot [P_R]_i$$

where $[P_R]_i$ is the removal rate for step i, $T_i$ is polishing time for step i (to be calculated below), $T_{base}$ is the polishing time for the test wafers, e.g., 30 seconds, and N is the total number of polishing steps. The predicted wafer profile $[P_P]$ is simply the difference between the initial profile and the total removal profile, i.e., $[P_P]=[P_I]-[P_R]_T$.

In order to generate the recipe, the recipe generator calculates the set of polishing times Ti that will result in the minimum variation of the predicted wafer profile $[P_P]$ from the desired profile $[P_D]$ (step 218). The minimization can be performed for a certain diameter range across the wafer, e.g., from 3 to 197 mm, or from 10 to 190 mm, and the like. The minimization calculation can be performed with conventional techniques. For example, the matrices $[P_D]$, $[P_I]$, $[P_R]_i$, and the polish times $T_i$ can be entered into cells in an Excel$^R$ spreadsheet, equations equivalent to those set forth above can be entered into the spreadsheet, and the polish times $T_i$ may be calculated using the Solver function of Excel to minimize the total difference between the predicted wafer profile $[P_P]$ and the desired profile $[P_D]$. Alternatively, the polishing times may be optimized also by introducing one or more deviation variables, for example, $[z_{min}]$ and $[z_{max}]$ and using them as boundaries to minimize weighted deviations between the predicted wafer profile $[P_P]$ and the desired profile $[P_D]$.

These calculated polishing times $T_i$ can then be entered manually into the chemical mechanical polishing control system, which performs each polishing step in order for the calculated amount of time $T_i$ (step 220).

In a production system, data would be passed automatically between various components. For example, the initial wafer profile would be passed automatically from the metrology system to the recipe generator, and the polishing times Ti would be passed automatically from the recipe generator to the control system. In fact, the recipe generator could be implemented as part of the control system itself. Alternatively, the calculated polishing times could be stored as part of a polishing recipe in a separate file in a computer readable medium. The polishing recipe, with the associated polishing times, could then be loaded into the control software for the polishing apparatus when needed.

Although most likely implemented as software in a general purpose digital computer and stored as instructions tangibly embodied in a computer readable medium, the recipe generator could also be implemented with hardware, firmware, software, or combinations thereof, including application specific integrated circuits (ASIC).

A number of embodiments of the invention have been described. Nevertheless, it will be understood that various modifications may be made without departing from the spirit and scope of the invention. Accordingly, other embodiments are within the scope of the following claims.

What is claimed is:

1. A method of determining a polishing recipe, comprising:
   polishing a plurality of test substrates with a plurality of polishing parameter sets, the polishing step including polishing at least one test substrate for each polishing parameter set in the plurality of polishing parameter sets;
   measuring a polishing profile for each of the plurality of test substrates; and
   calculating a polishing time for each polishing parameter set and calculating, based on the polishing profiles for the test substrates and the polishing time for each parameter set, a predicted substrate profile that results from polishing a device substrate using each of the plurality of polishing parameter sets for the polish time associated with that polishing parameter set so that the difference between the predicted substrate profile and a desired substrate profile is minimized.

2. The method of claim 1, further comprising polishing a device substrate using each of the polishing parameter sets in series for the polishing time calculated for that polishing parameter set.

3. The method of claim 1, further comprising determining an initial profile for the device substrate.

4. The method of claim 3, wherein the calculating step includes calculating the predicted substrate profile from a difference between a total polishing profile and an initial polishing profile.

5. The method of claim 4, further comprising calculating the total polishing profile from a sum of the products of the polishing times and an associated measured profiles of the test substrates.

6. The method of claim 1, wherein calculating a polishing time $T_i$ for each polishing parameter set includes representing a total removal profile $[P_R]_T$ as $$[P_R]_T = \sum_{i=1}^{N} \frac{T_i}{T_{base}} [P_R]_i$$

where $[P_R]_i$ is the measured profile of the test substrate and $T_{base}$ is the amount of time that the test substrate was polished.

7. The method of claim 6, further comprising iteratively calculating $T_i$ to minimize the value of $[P_D]-([P_I]-[P_R]_T)$, where $[P_D]$ is a desired polishing profile and $[P_I]$ is a thickness profile of the substrate prior to polishing.

8. The method of claim 1, wherein each polishing parameter set includes one or more polishing parameters selected from the group consisting of a contact region diameter, a contact pressure, an edge control ring pressure and a retaining ring pressure.

9. The method of claim 8, wherein the plurality of polishing parameter sets include at least
   a first polishing parameter set including a first contact region diameter, a first contact pressure, a first edge control ring pressure and a first retaining ring pressure,
   a second polishing parameter set including a first contact region diameter, a first contact pressure, a first edge control ring pressure and a second retaining ring pressure,
   a third polishing parameter set including a first contact region diameter, a first contact pressure, a second edge control ring pressure and a first retaining ring pressure, and
   a fourth polishing parameter set including a first contact region diameter, a first contact pressure, a second edge control ring pressure and a second retaining ring pressure.

10. A method of determining a polishing recipe, comprising:
    polishing a plurality of test substrates with a plurality of carrier head parameter sets that can be used during polishing of actual device substrates, including
    polishing a first set of test substrates to determine a variation in polishing profile as a function of a contact region diameter, polishing a second set of test substrates to determine the variation in the polishing profile as a function of a retaining ring pressure;

measuring an amount of material removed at a plurality of different radial positions on each test substrate;

creating a desired profile which represents a desired thickness across the substrate; and calculating a polishing time for each of the plurality of carrier head parameter sets that will result in predicted substrate profile substantially equal to the desired substrate profile.

11. The method of claim 10, wherein polishing a plurality of test substrates includes polishing a third set of test substrates to determine the variation in the polishing profile as a function of an edge control ring pressure.

12. A computer program product tangibly stored on a computer-readable medium, the program comprising instructions operable to cause a machine to:

polish a plurality of test substrates with a plurality of polishing parameter sets;

measure a polishing profile for each of the plurality of test substrates; and calculate a polishing time for each polishing parameter set which minimizes the difference between a predicted substrate profile and a desired substrate profile.

* * * * *

UNITED STATES PATENT AND TRADEMARK OFFICE
CERTIFICATE OF CORRECTION

PATENT NO. : 6,439,964 B1 Page 1 of 1
DATED : August 27, 2002
INVENTOR(S) : Gopalakrishna B. Prabhu and Steve T. Mear It is certified that error appears in the above-identified patent and that said Letters Patent is hereby corrected as shown below:

<u>Title page,</u>
Item [75], replace inventor name "Gopalakrishna B. Prahbu" with
-- Gopalakrishna B. Prabhu --

Signed and Sealed this

Eleventh Day of November, 2003

JAMES E. ROGAN
*Director of the United States Patent and Trademark Office*